United States Patent
Lin et al.

(10) Patent No.: US 9,269,816 B2
(45) Date of Patent: Feb. 23, 2016

(54) THIN FILM TRANSISTOR

(71) Applicant: E Ink Holdings Inc., Hsinchu (TW)

(72) Inventors: Kuan-Yi Lin, Hsinchu (TW); Fang-An Shu, Hsinchu (TW); Yao-Chou Tsai, Hsinchu (TW); Tzung-Wei Yu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/914,637

(22) Filed: Jun. 11, 2013

(65) Prior Publication Data
US 2014/0070216 A1   Mar. 13, 2014

(30) Foreign Application Priority Data

Sep. 11, 2012  (TW) .............................. 101133185 A

(51) Int. Cl.
H01L 29/78      (2006.01)
H01L 29/786     (2006.01)

(52) U.S. Cl.
CPC ........ *H01L 29/786* (2013.01); *H01L 29/78648* (2013.01)

(58) Field of Classification Search
CPC ............ H01L 29/7869; H01L 27/1225; H01L 29/4908; H01L 29/78696; H01L 29/66742; H01L 27/1214; G02F 2001/134345; G02F 1/136213; G02F 1/13624; G02F 1/133707; G02F 1/133753; G06F 3/0412
USPC .................................. 257/57, 59, 66, 40, 72
See application file for complete search history.

(56) References Cited

U.S. PATENT DOCUMENTS

| | | | |
|---|---|---|---|
| 5,140,391 A | 8/1992 | Hayashi et al. | |
| 5,917,210 A | 6/1999 | Huang et al. | |
| 8,023,174 B2 | 9/2011 | Huang et al. | |
| 2004/0070718 A1* | 4/2004 | Saigo et al. | 349/141 |
| 2007/0026580 A1* | 2/2007 | Fujii | 438/149 |
| 2007/0052647 A1 | 3/2007 | Chen | |
| 2007/0262377 A1 | 11/2007 | Asa | |
| 2010/0001272 A1 | 1/2010 | Ye | |
| 2010/0244029 A1 | 9/2010 | Yamazaki et al. | |
| 2012/0025320 A1* | 2/2012 | Chen et al. | 257/369 |
| 2013/0088460 A1* | 4/2013 | Ahn et al. | 345/175 |

FOREIGN PATENT DOCUMENTS

| | | |
|---|---|---|
| CN | 1727976 | 2/2006 |
| CN | 101728434 | 6/2010 |
| TW | 200703652 | 1/2007 |

OTHER PUBLICATIONS

"Office Action of Taiwan Counterpart Application", issued on Dec. 2, 2011, p. 1-p. 5.
"Office Action of China Counterpart Application", issued on Nov. 4, 2015, p. 1-p. 7, in which the listed references were cited.

* cited by examiner

Primary Examiner — Julio J Maldonado
Assistant Examiner — Rodolfo Fortich
(74) Attorney, Agent, or Firm — Jianq Chyun IP Office

(57) ABSTRACT

A thin film transistor (TFT) is provided, which includes a substrate, a first gate layer, an insulation layer, a first source/drain layer, a second source/drain layer, a semiconductor layer, a passivation layer and a second gate layer. The first gate layer is disposed on the substrate. The insulation layer is disposed on the first gate layer. The first source/drain layer is disposed on the insulation layer. The second source/drain layer is disposed on the insulation layer. The semiconductor layer is disposed on the insulation layer and covers the first source/drain layer and the second source/drain layer. The passivation layer is disposed on the insulation layer and covers the semiconductor layer. The second gate layer is disposed on the passivation layer and contacts the first gate layer through a via so that the two gate layers keep a same voltage level.

11 Claims, 3 Drawing Sheets

THIN FILM TRANSISTOR

CROSS-REFERENCE TO RELATED APPLICATION

This application claims the priority benefit of Taiwan application serial no. 101133185, filed on Sep. 11, 2012. The entirety of the above-mentioned patent application is hereby incorporated by reference herein and made a part of this specification.

BACKGROUND OF THE INVENTION

1. Field of the Invention

The invention generally relates to a transistor, and more particularly, to a thin film transistor (TFT).

2. Description of Related Art

A TFT can be roughly categorized into a staggered one and a coplanar one based on the structure layout of the layers thereof. For the staggered TFT, the semiconductor layer is disposed between the gate layer (or the insulation layer) and the source/drain layer thereof; for the coplanar TFT, the source/drain layer is disposed the gate layer (or the insulation layer) and the semiconductor layer thereof. In addition, the coplanar TFT can be further divided into a top gate type where the gate layer is located at the upper portion of the TFT and a bottom gate type where the gate layer is located at the lower portion of the TFT.

For the current coplanar TFT, the carrier transmission channel over the source/drain layer of the TFT is affected by a shielding effect of the source/drain layer where the electrical field produced by the gate layer below the source/drain layer is shielded, so that there is no charge accumulation at the region where the electrical field is shielded, which leads to increasing the impedance of the carrier transmission channel and reduces the mobility of carriers thereof.

SUMMARY OF THE INVENTION

Accordingly, the invention is directed to a TFT able to reduce the shielding effect produced by the TFT itself.

The invention provides a TFT, which includes a substrate, a first gate layer, an insulation layer, a first source/drain layer, a second source/drain layer, a semiconductor layer, a passivation layer and a second gate layer. The first gate layer is disposed on the substrate. The insulation layer is disposed on the first gate layer. The first source/drain layer is disposed on the insulation layer. The second source/drain layer is disposed on the insulation layer. The semiconductor layer is disposed on the insulation layer and covers the first source/drain layer and the second source/drain layer. The passivation layer is disposed on the insulation layer and covers the semiconductor layer. The second gate layer is disposed on the passivation layer and contacts the first gate layer through a via so that the second gate layer and the first gate layer keep a same voltage level.

In an embodiment of the invention, the first gate layer induces a first carrier transmission channel at the semiconductor layer.

In an embodiment of the invention, the first carrier transmission channel is located at a side of the semiconductor layer close to the insulation layer.

In an embodiment of the invention, the first carrier transmission channel is located between the first source/drain layer and the second source/drain layer.

In an embodiment of the invention, the perpendicular projection of the second gate layer on the insulation layer is overlapped with the first carrier transmission channel.

In an embodiment of the invention, the second gate layer induces a second carrier transmission channel at the semiconductor layer.

In an embodiment of the invention, the second carrier transmission channel is located at a side of the semiconductor layer close to the passivation layer.

In an embodiment of the invention, the second carrier transmission channel is located over the first source/drain layer.

In an embodiment of the invention, the second gate layer induces a third carrier transmission channel at the semiconductor layer.

In an embodiment of the invention, the third carrier transmission channel is located at a side of the semiconductor layer close to the passivation layer.

In an embodiment of the invention, the third carrier transmission channel is located over the second source/drain layer.

In an embodiment of the invention, the semiconductor layer contacts the insulation layer.

Based on the description above, in the embodiments of the invention, vias are used to make the first gate layer connected to the second gate layer so that the two gate layers contact each other to keep a same voltage level, which can reduce the shielding effect produced by the TFT itself.

Other objectives, features and advantages of the invention will be further understood from the further technological features disclosed by the embodiments of the invention wherein there are shown and described preferred embodiments of this invention, simply by way of illustration of modes best suited to carry out the invention.

DESCRIPTION OF THE EMBODIMENTS

Reference will now be made in detail to the present embodiments of the invention, examples of which are illustrated in the accompanying drawings.

Figure 1:
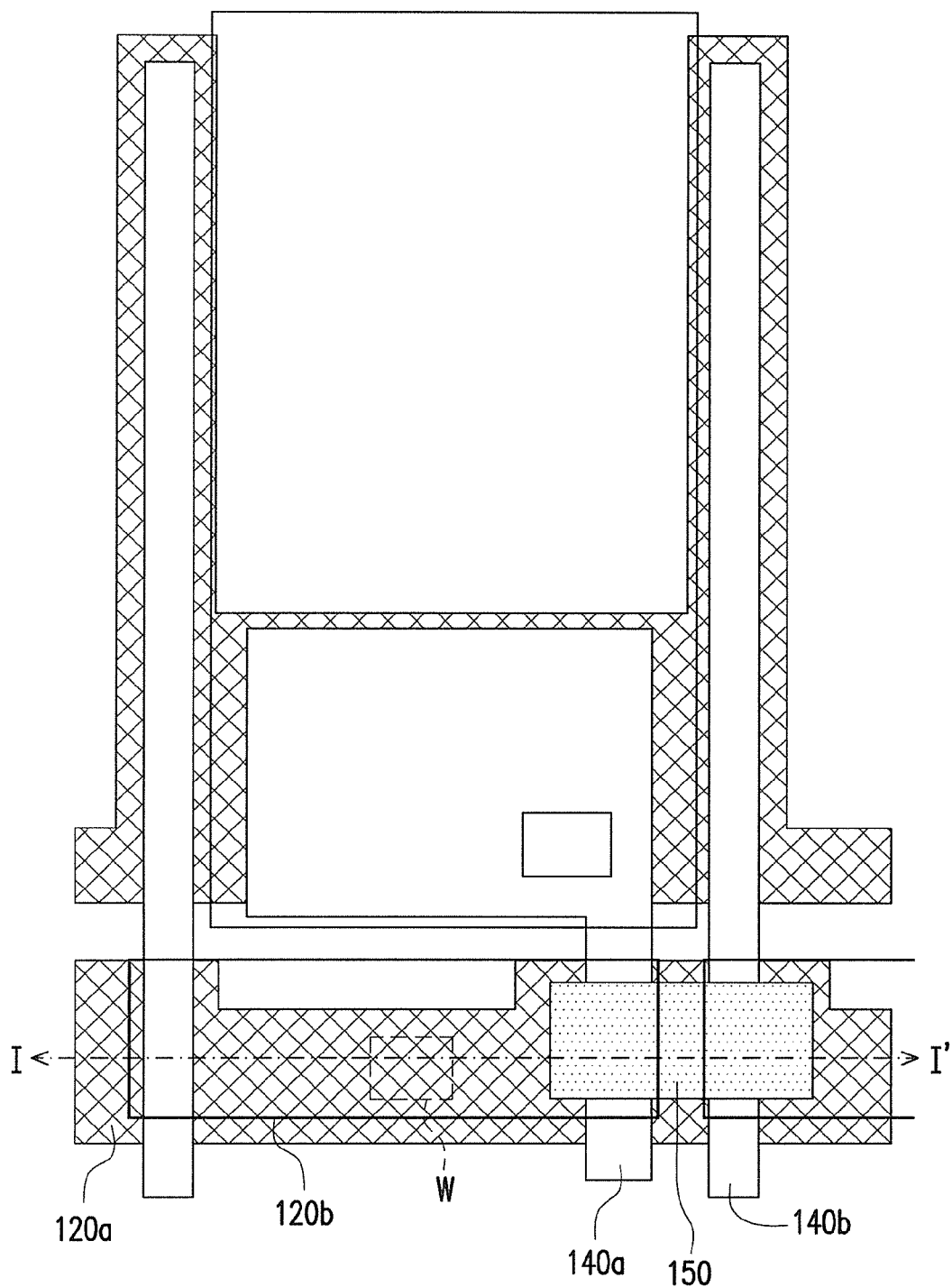
FIG. 1 is a top-view diagram of the pixel structure of a TFT according to an embodiment of the invention.
Figure 2:
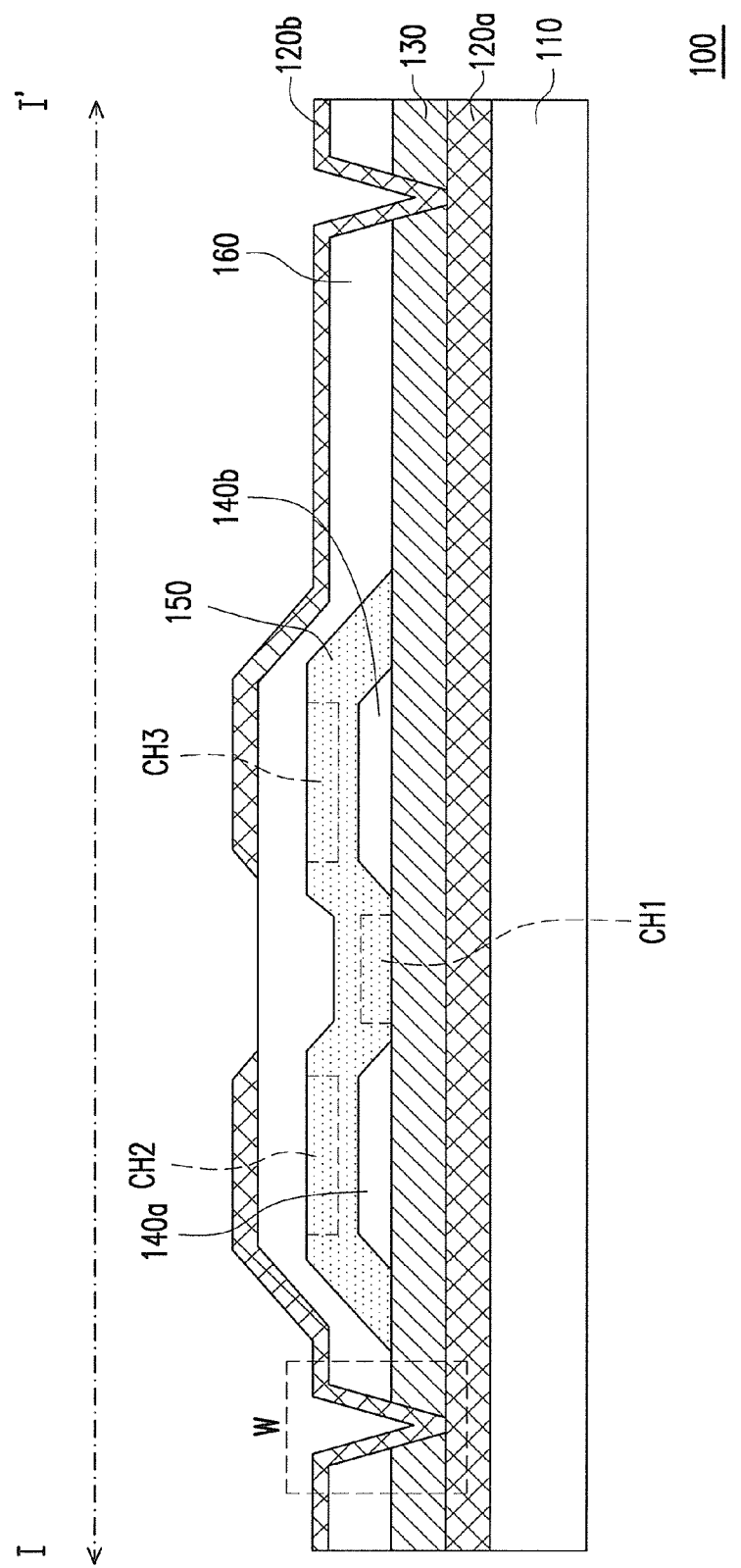
FIG. 2 is a cross-sectional diagram of the pixel structure in FIG. 1 along line I-I'.

FIG. 1 is a top-view diagram of the pixel structure of a TFT according to an embodiment of the invention and FIG. 2 is a cross-sectional diagram of the pixel structure in FIG. 1 along line I-I'. Referring to FIGS. 1 and 2, a TFT 100 in the embodiment includes a substrate 110, a first gate layer 120a, an insulation layer 130, a first source/drain layer 140a, a second source/drain layer 140b, a semiconductor layer 150, a passivation layer 160 and a second gate layer 120b.

The first gate layer 120a serves as the bottom gate layer of the TFT 100 disposed on the substrate 110. When the first gate layer 120a is applied by a bias, the first gate layer 120a induces a first carrier transmission channel CH1 in the semiconductor layer 150 and the first carrier transmission channel CH1 is located at a side of the semiconductor layer 150 close to the insulation layer 130 to provide transmission of carriers such as electrons. In the embodiment, the material of the first gate layer 120a is, for example molybdenum (Mo), aluminum (Al), titanium (Ti) and other metallic materials, an alloy thereof or a metallic stacking layer thereof.

The insulation layer 130 is disposed on the first gate layer 120a to barrier the first source/drain layer 140a and the second source/drain layer 140b from the first gate layer 120a and avoid the sources/drains from electrical connecting the gate. In the embodiment, the material of the insulation layer 130 is, for example, silicon oxide or silicon nitride both with high dielectric constant.

The first source/drain layer 140a and the second source/drain layer 140b are disposed on the insulation layer 130. In the embodiment, the first carrier transmission channel CH1 in the semiconductor layer 150 induced by the first gate layer 120a is located between the first source/drain layer 140a and the second source/drain layer 140b, and the materials of the first source/drain layer 140a and the second source/drain layer 140b are, for example, molybdenum (Mo), aluminum (Al), titanium (Ti) and other metallic materials, an alloy thereof or a metallic stacking layer thereof. In the application practice, the first source/drain layer 140a can serve as a source or a drain of the TFT 100 depending on the current direction therein.

The semiconductor layer 150 is disposed on the insulation layer 130 and covers the first source/drain layer 140a and the second source/drain layer 140b. It can be seen from FIG. 2 that the semiconductor layer 150 herein entirely overlaps the first source/drain layer 140a and the second source/drain layer 140b. In the embodiment, the material of the semiconductor layer 150 is, for example, metal oxide semiconductor (MOS), in more details, it is, for example, indium zinc oxide, zinc oxide, aluminum-doped zinc oxide, indium gallium zinc oxide or a combinations thereof.

The passivation layer 160 is disposed on the insulation layer 130 and covers the semiconductor layer 150. The passivation layer 160 in the application can avoid the structure of the layers of the TFT 100 from being damaged and advance the reliability thereof.

The second gate layer 120b, as the top gate layer of the TFT 100, is disposed on the passivation layer 160. When the second gate layer 120b is applied by a bias, the second gate layer 120b induces a second carrier transmission channel CH2 and a third carrier transmission channel CH3 in the semiconductor layer 150, both which are located at a side in the semiconductor layer 150 close to the passivation layer 160 to provide transmission of carriers such as electrons. In the embodiment, the second carrier transmission channel CH2 is located over the first source/drain layer 140a and the third carrier transmission channel CH3 is located over the second source/drain layer 140b. In the embodiment, the material of the second gate layer 120b is, for example, molybdenum (Mo), aluminum (Al), titanium (Ti) and other metallic materials, an alloy thereof or a metallic stacking layer thereof.

In the embodiment, the insulation layer 130 and the passivation layer 160 have a via W for connecting the first gate layer 120a to the second gate layer 120b to make them contact each other and keep a same voltage level. In the application practical operation, therefore, the first gate layer 120a and the second gate layer 120b respectively induce a carrier transmission channel in the semiconductor layer 150 so as to advance the mobility of carriers. By using the connection method of the via W, the first gate layer 120a and the second gate layer 120b of the TFT 100 can keep a same level to reduce the shielding effect produced by the source/drain layers in the TFT 100.

Figure 3:
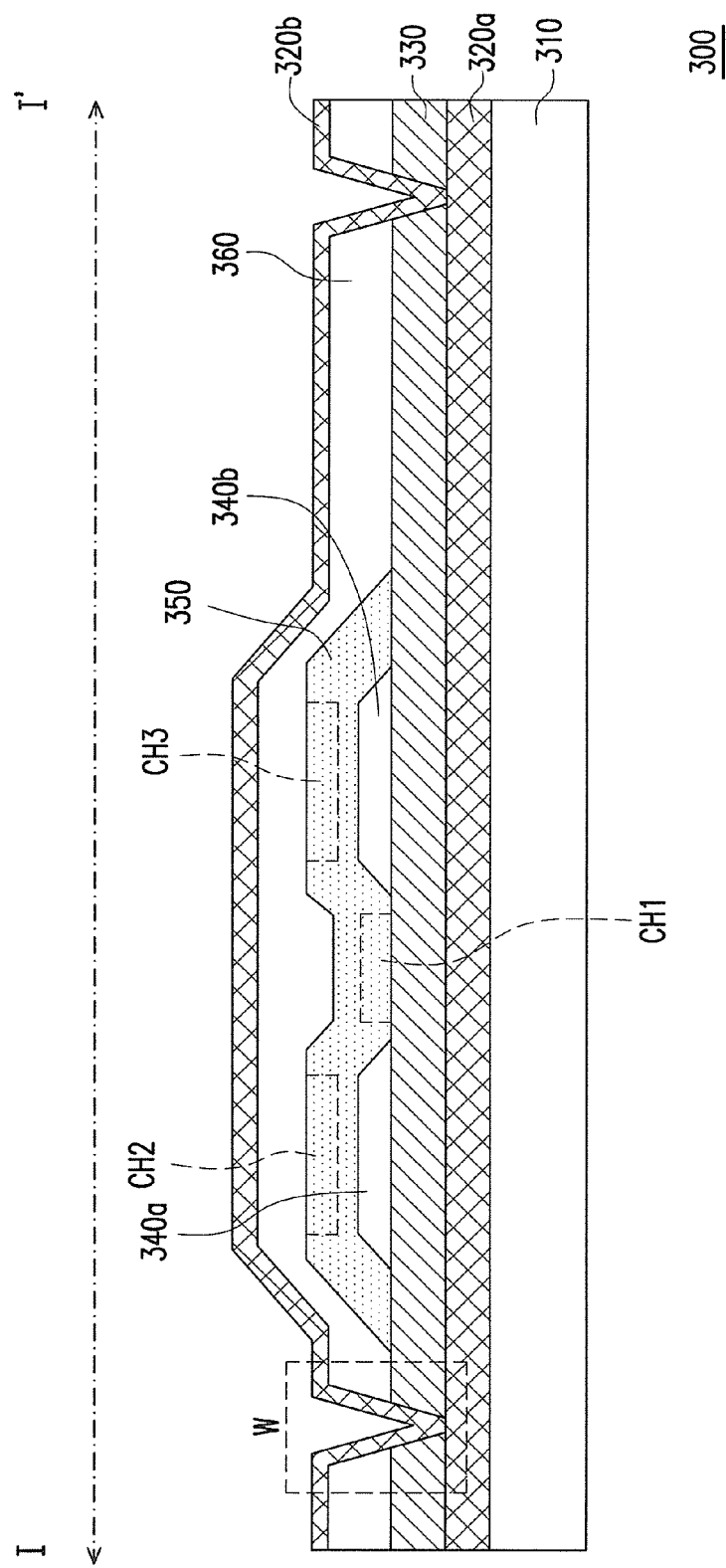
FIG. 3 is a cross-sectional diagram of the pixel structure of a TFT according to another embodiment of the invention.

FIG. 3 is a cross-sectional diagram of the pixel structure of a TFT according to another embodiment of the invention. Referring to FIGS. 1 and 3, the TFT 300 of the embodiment is similar to the TFT 100 in FIG. 1. However, different from FIG. 1, the second gate layer 320b of the TFT 300 entirely overlap the passivation layer 360. That is to say, the perpendicular projection of the second gate layer 320b on the insulation layer 330 is overlapped with the first carrier transmission channel CH1, and the region of the second gate layer 320b over the first carrier transmission channel CH1 is distributed continually with no opening.

The layout of all the layers of the TFT 300 in the embodiment can refer to FIG. 3, in which the functions of the layers are similar to the embodiment of FIG. 2 and the instruction, advice and implementation note thereof, which is omitted to describe.

In summary, the embodiments of the invention have at least one of the following advantages. The TFT has bi-gates structure, the second gate layer thereof is disposed over the passivation layer, and the bi-gates of the TFT can keep a same voltage level to reduce the shielding effect. In addition, during the real operation, the second gate layer and the first gate layer respectively induce a carrier transmission channel in the semiconductor layer to advance the mobility of carriers of the component.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A thin film transistor, comprising:
   a substrate;
   a first gate layer, disposed on the substrate;
   an insulation layer, disposed on the first gate layer;
   a first source/drain layer, disposed on the insulation layer;
   a second source/drain layer, disposed on the insulation layer;
   a semiconductor layer, disposed on the insulation layer and covering the first source/drain layer and the second source/drain layer;
   a passivation layer, disposed on the insulation layer and covering the semiconductor layer; and
   a second gate layer, disposed on the passivation layer,
   wherein the second gate layer contacts the first gate layer through a via so that the second gate layer and the first gate layer keep a same voltage level, and the second gate layer induces a second carrier transmission channel at the semiconductor layer wherein the thin film transistor is a coplanar thin film transistor.

2. The thin film transistor as claimed in claim 1, wherein the first gate layer induces a first carrier transmission channel at the semiconductor layer.

3. The thin film transistor as claimed in claim 2, wherein the first carrier transmission channel is located at a side of the semiconductor layer close to the insulation layer.

4. The thin film transistor as claimed in claim 2, wherein the first carrier transmission channel is located between the first source/drain layer and the second source/drain layer.

5. The thin film transistor as claimed in claim 2, wherein a perpendicular projection of the second gate layer on the insulation layer is overlapped with the first carrier transmission channel.

6. The thin film transistor as claimed in claim 1, wherein the second carrier transmission channel is located at a side of the semiconductor layer close to the passivation layer.

7. The thin film transistor as claimed in claim 1, wherein the second carrier transmission channel is located over the first source/drain layer.

8. The thin film transistor as claimed in claim 1, wherein the second gate layer induces a third carrier transmission channel at the semiconductor layer.

9. The thin film transistor as claimed in claim 8, wherein the third carrier transmission channel is located at a side of the semiconductor layer close to the passivation layer.

10. The thin film transistor as claimed in claim 8, wherein the third carrier transmission channel is located over the second source/drain layer.

11. The thin film transistor as claimed in claim 1, wherein the semiconductor layer contacts the insulation layer.

* * * * *